(12) United States Patent
Li et al.

(10) Patent No.: US 9,076,923 B2
(45) Date of Patent: Jul. 7, 2015

(54) LIGHT-EMITTING DEVICE MANUFACTURING METHOD

(75) Inventors: Cheng-Hsien Li, Kaohsiung (TW);
Chi-Hao Huang, Zhubei (TW);
Hsin-Hsiung Huang, Toufen Township (TW)

(73) Assignee: EPISTAR CORPORATION, Hsinchu (TW)

( * ) Notice: Subject to any disclaimer, the term of this patent is extended or adjusted under 35 U.S.C. 154(b) by 675 days.

(21) Appl. No.: 13/371,670

(22) Filed: Feb. 13, 2012

(65) Prior Publication Data
US 2013/0210178 A1    Aug. 15, 2013

(51) Int. Cl.
*H01L 33/20* (2010.01)
*H01L 33/44* (2010.01)
*H01L 33/00* (2010.01)
*H01L 33/40* (2010.01)

(52) U.S. Cl.
CPC .............. *H01L 33/20* (2013.01); *H01L 33/0079* (2013.01); *H01L 33/0095* (2013.01); *H01L 33/405* (2013.01); *H01L 33/44* (2013.01)

(58) Field of Classification Search
CPC ................................. H01L 33/20; H01L 33/44
USPC .................................................... 438/114, 465
See application file for complete search history.

(56) References Cited

U.S. PATENT DOCUMENTS

| 5,429,954 | A * | 7/1995 | Gerner ............................ 438/33 |
| 7,598,149 | B2 * | 10/2009 | Dawson et al. ............... 438/343 |
| 2008/0087875 | A1 * | 4/2008 | Fan et al. ......................... 257/13 |
| 2008/0230789 | A1 * | 9/2008 | Onushkin et al. ............... 257/88 |
| 2008/0277793 | A1 * | 11/2008 | Noma et al. .................... 257/758 |
| 2012/0001222 | A1 * | 1/2012 | Moon et al. ..................... 257/99 |

* cited by examiner

*Primary Examiner* — Mary Wilczewski
*Assistant Examiner* — Toniae Thomas
(74) *Attorney, Agent, or Firm* — Ditthavong & Steiner, P.C.

(57) ABSTRACT

A method for manufacturing a light-emitting device comprising the steps of: providing a first substrate, a chip area, and a street area; forming a light-emitting structure on the first substrate; forming a conductive structure between the first substrate and the light-emitting structure; removing a part of the light-emitting structure in the street area to expose a sidewall of the light-emitting structure in the chip area; forming a first passivation layer on the light-emitting structure in the chip area; forming a second passivation layer on the conductive structure in the street area, on the sidewalls of the light-emitting structure, and on the sidewalls of the first passivation layer; forming a through-hole in the first passivation layer, and forming an electrode in the through-hole.

19 Claims, 14 Drawing Sheets

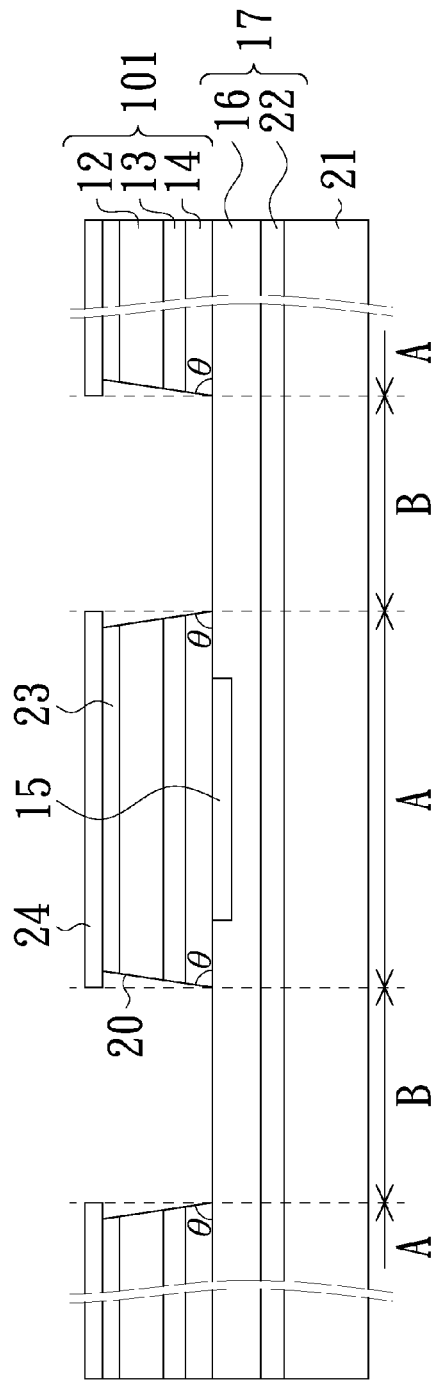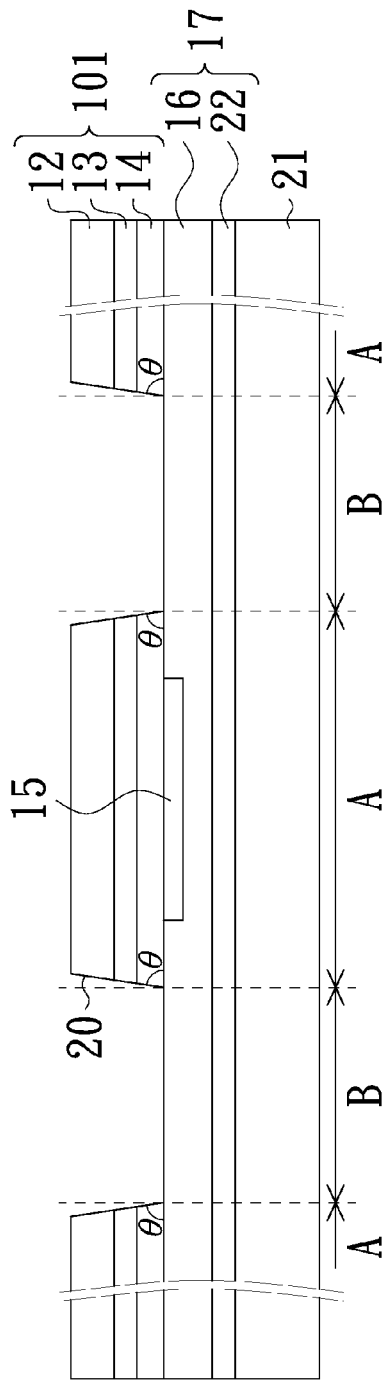

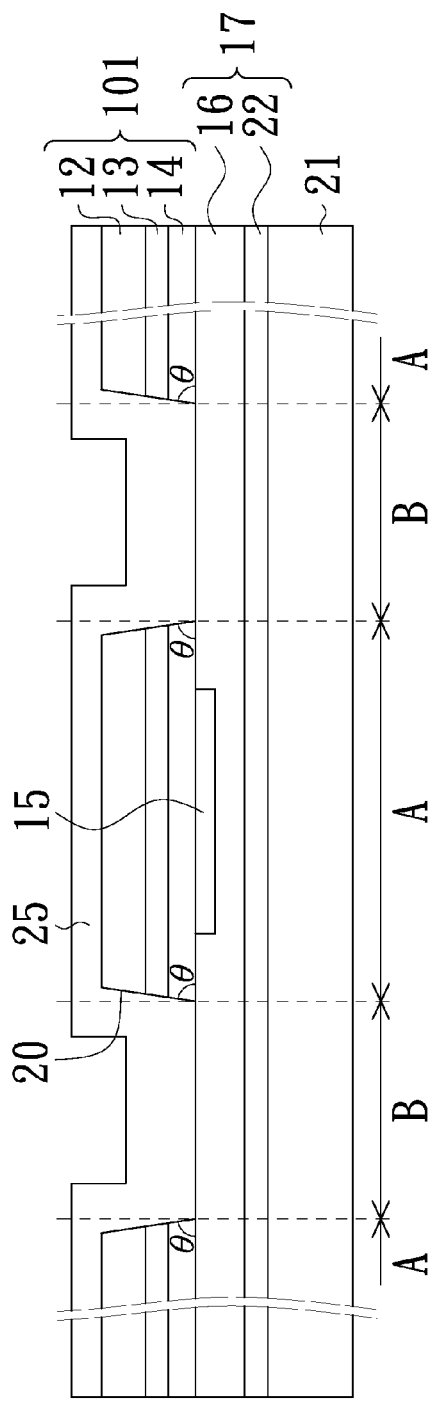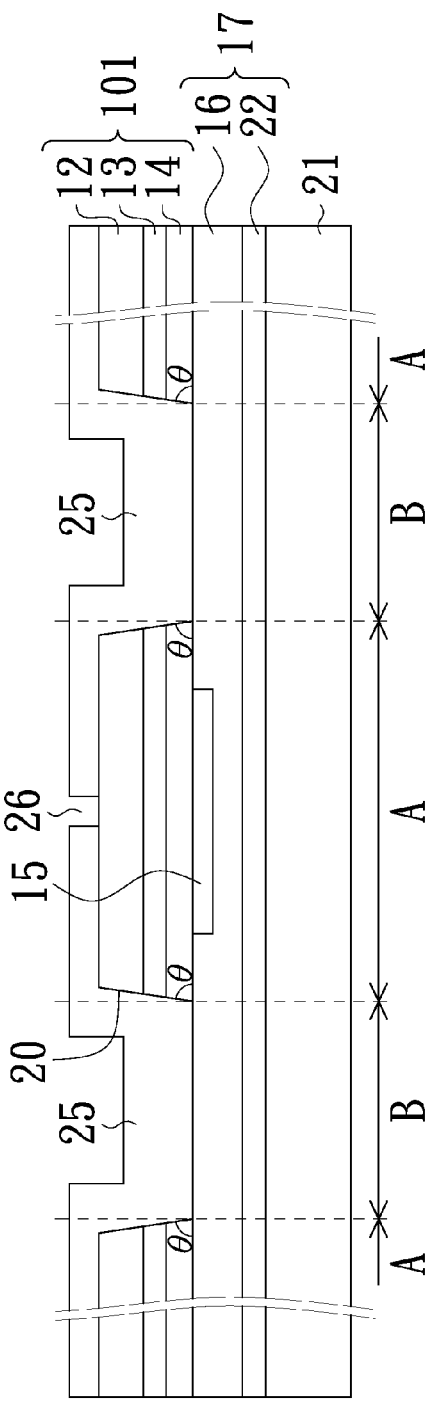

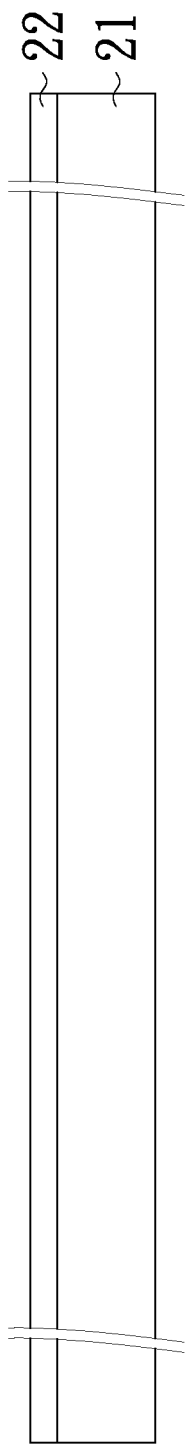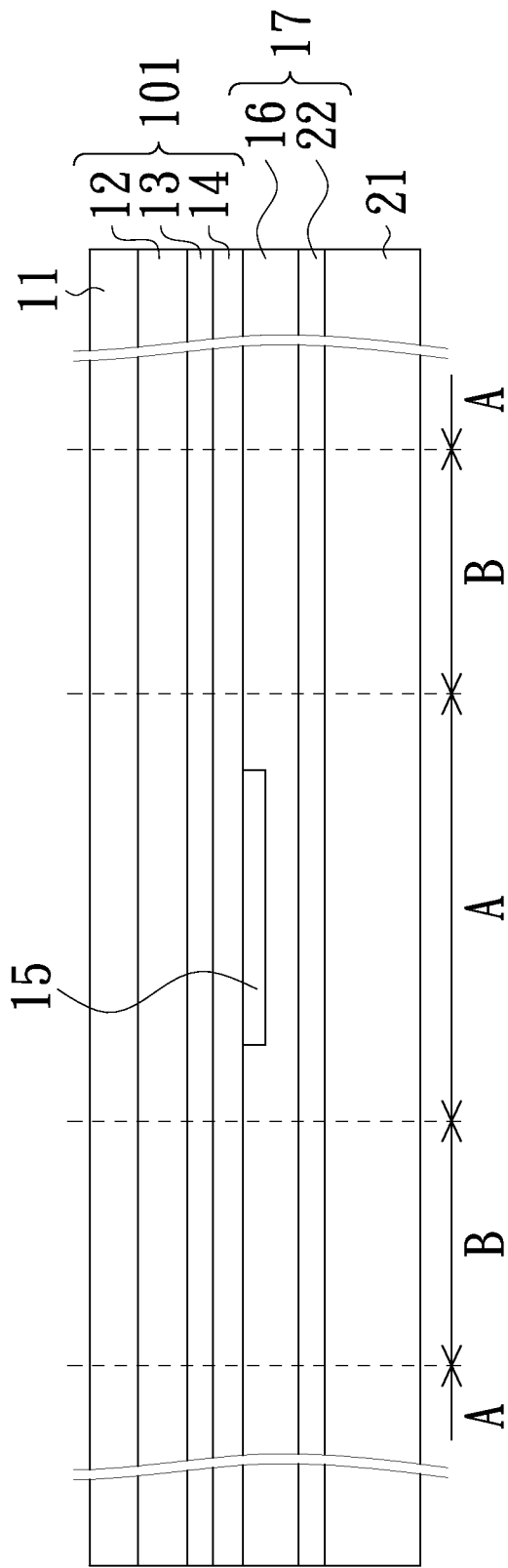

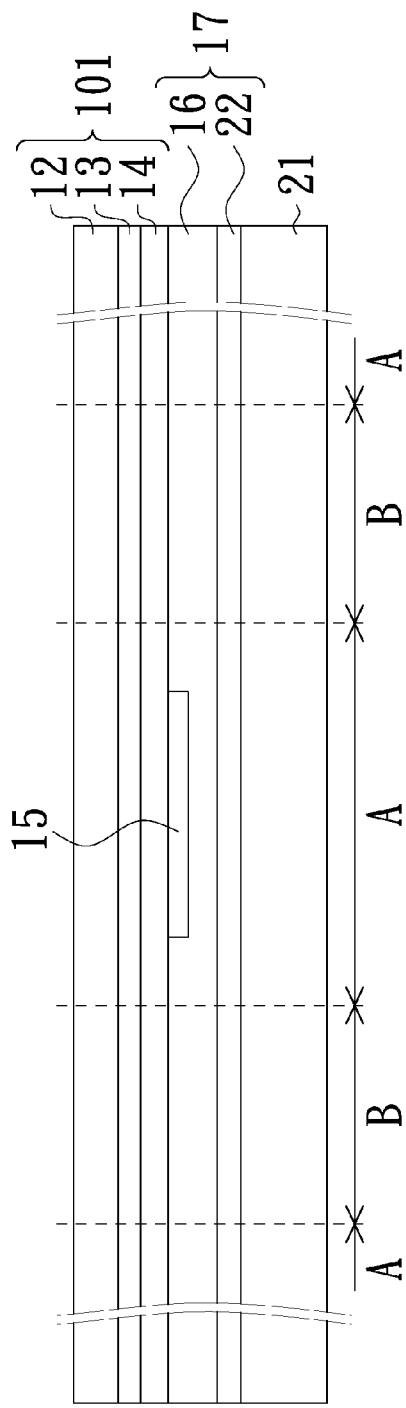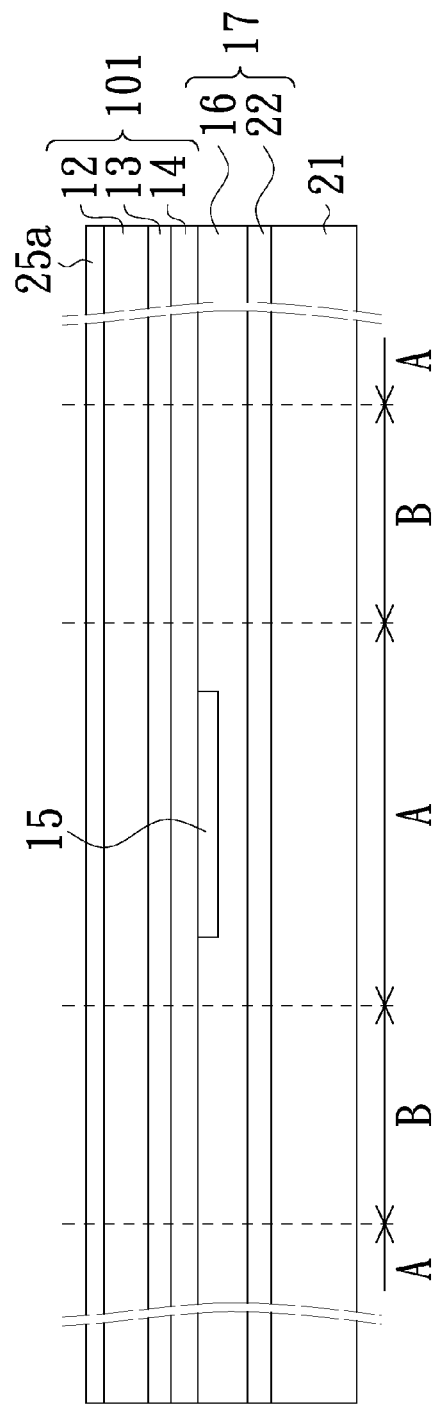

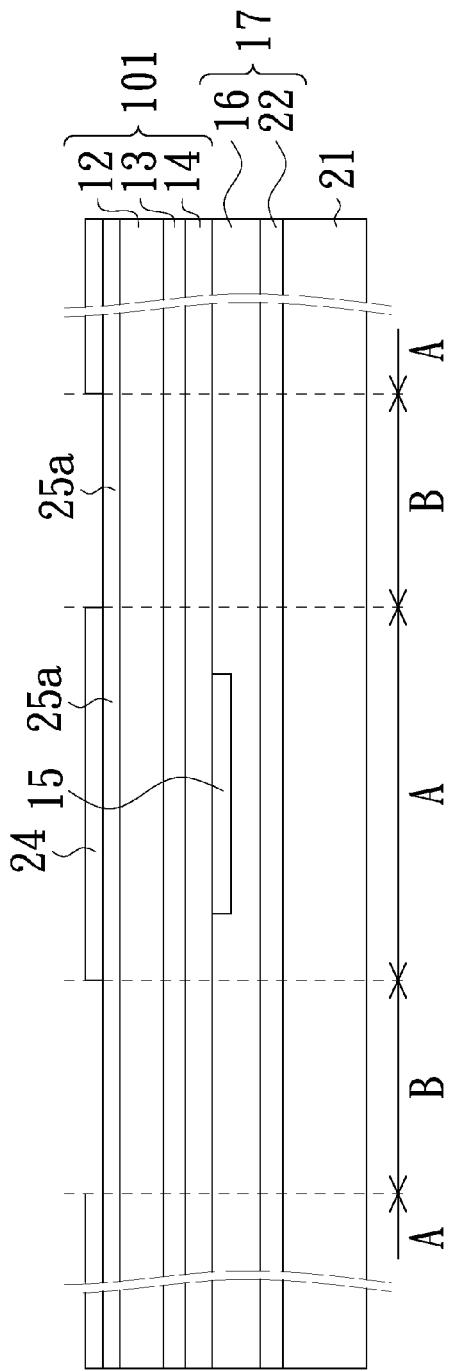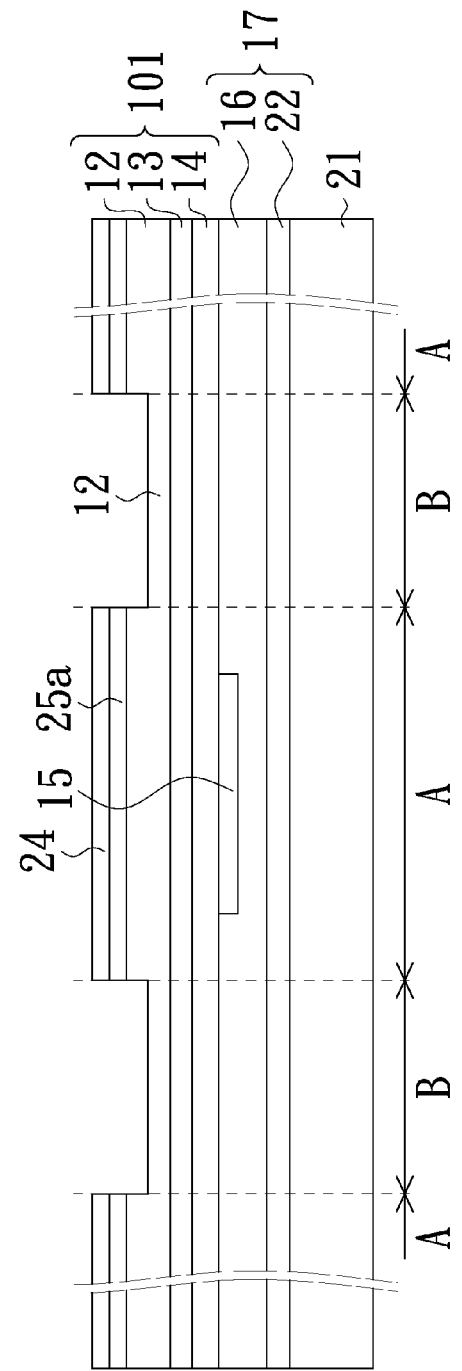

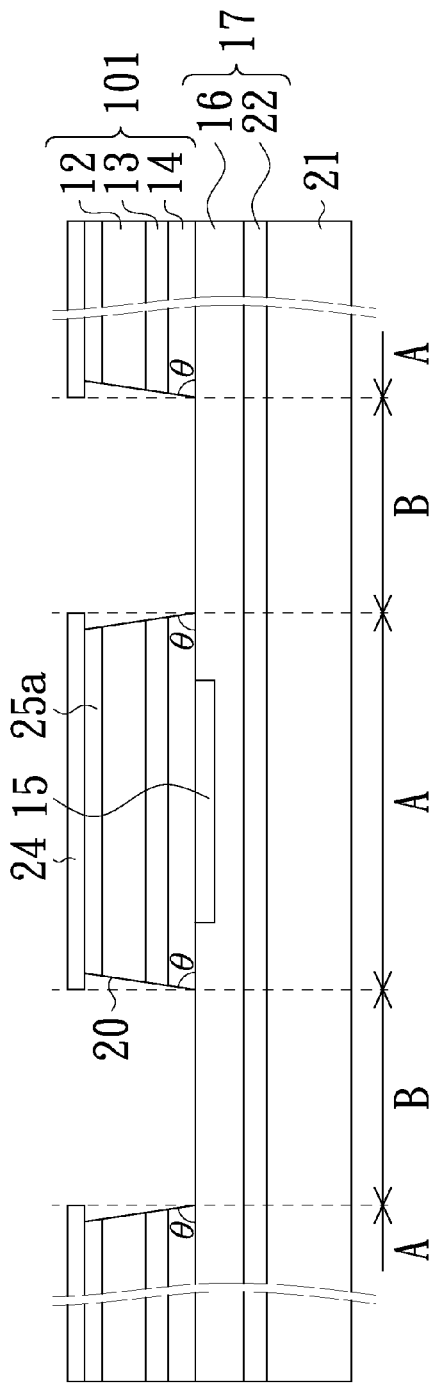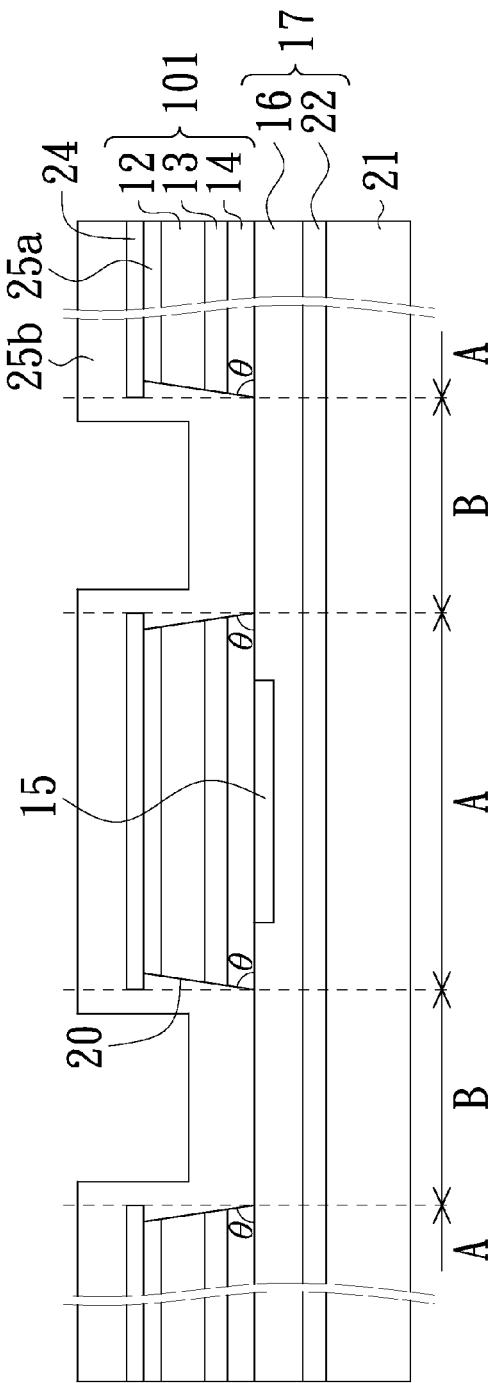

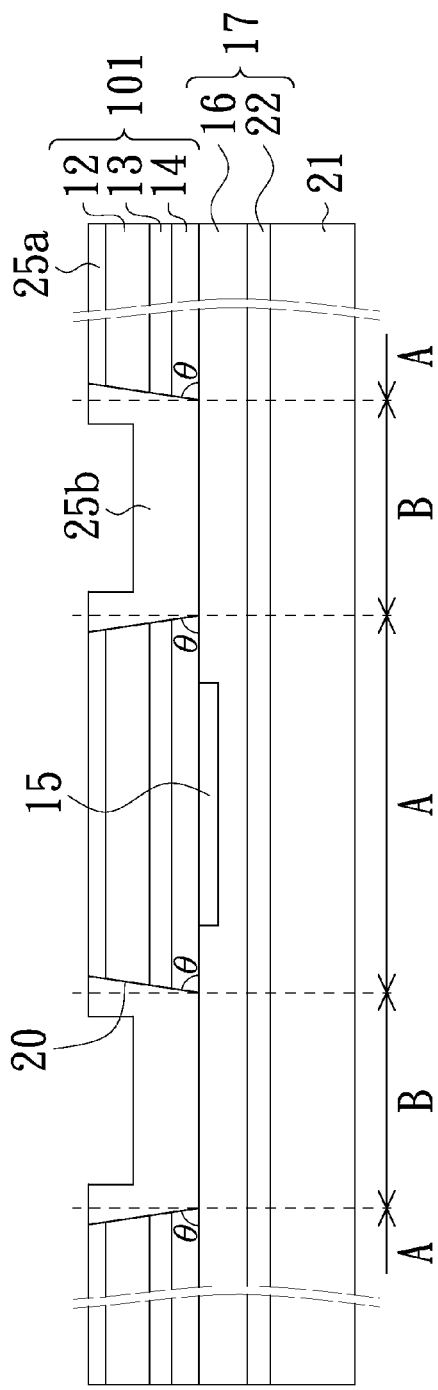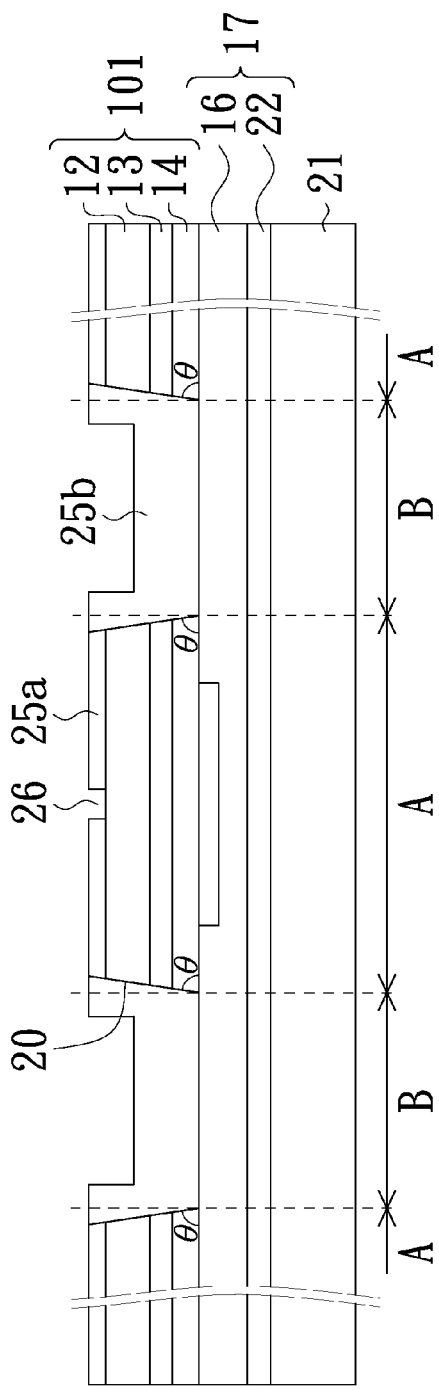

LIGHT-EMITTING DEVICE MANUFACTURING METHOD

TECHNICAL FIELD

The present application relates to a method for manufacturing a light-emitting device, and more particularly to a method for manufacturing a III-V compound semiconductor light-emitting device with a passivation layer.

BACKGROUND

The light radiation theory of light-emitting device is to generate light from the energy released by the electrons moving between the n-type semiconductor layer and the p-type semiconductor layer. Because the light radiation theory of light-emitting device is different from that of the incandescent light which heats the filament, the light-emitting device is called a "cold" light source.

Moreover, the light-emitting device is more sustainable, has a long life-time, is light, handy, and uses less power consumption, therefore it is considered as a new light source for the illumination market. The light-emitting device applies to various applications like the traffic signal, backlight module, street light and medical instruments, and is gradually replacing the traditional lighting sources.

A vertical light-emitting device fails easily due to a high reverse leakage current. There are several reasons contributing to a high reverse leakage current in the light-emitting device, for example, the metal migration from the conductive structure to the top of the light-emitting device, and the metal impurity attached to the sidewall of the light-emitting structure.

SUMMARY

The present application provides a method for manufacturing a light-emitting device to avoid failure of the light-emitting device, resulting from a high reverse leakage current.

The present application provides a method for manufacturing a light-emitting device comprising the steps of: providing a substrate, a plurality of chip areas, and a plurality of street areas; forming a light-emitting structure on the substrate, forming a conductive structure between the substrate and the light-emitting structure; removing a part of the light-emitting structure in the street areas to expose the conductive structure and a sidewall in the chip areas; and forming a passivation layer on the light-emitting structure in the chip areas and on the exposed conductive structure in the street areas.

The present application provides a method for manufacturing a light-emitting device comprising the steps of: providing a substrate, a plurality of chip areas and a plurality of street areas; forming a light-emitting structure on the substrate; forming a conductive structure between the substrate and the light-emitting structure; removing a part of the light-emitting structure in the street areas to expose the conductive structure and a sidewall of the light-emitting structure in the chip areas; forming a first passivation layer on the light-emitting structure in the chip areas; and forming a second passivation layer on the exposed conductive structure in the street areas, on the sidewall of the light-emitting structure, and on a sidewall of the first passivation layer.

The present application provides a method for manufacturing a light-emitting device comprising the steps of: providing a first substrate, a chip area, and a street area; forming a light-emitting structure on the first substrate; forming a conductive structure between the first substrate and the light-emitting structure; removing a part of the light-emitting structure in the street area to expose a sidewall of the light-emitting structure in the chip area; forming a first passivation layer on the light-emitting structure in the chip area; forming a second passivation layer on the conductive structure in the street area, on the sidewalls of the light-emitting structure, and on the sidewalls of the first passivation layer; and forming a through-hole in the first passivation layer, and forming an electrode in the through-hole.

The present application provides a method for manufacturing a light-emitting device comprising the steps of: providing a first substrate, a chip area, and a street area; forming a light-emitting structure on the first substrate; forming a conductive structure between the first substrate and the light-emitting structure; removing a part of the light-emitting structure in the street area to expose a sidewall of the light-emitting structure in the chip area; forming a first passivation layer on the light-emitting structure in the chip area; and forming a second passivation layer on the conductive structure in the street area, on the sidewalls of the light-emitting structure, and on the sidewalls of the first passivation layer; wherein the step of removing a part of the light-emitting structure comprises the steps of: dry etching a part of the light-emitting structure in the street area; and wet etching a remaining part of the light-emitting structure in the street area.

The present application provides a method for manufacturing a light-emitting device comprising the steps of: comprising the steps of: providing a first substrate, a chip area, and a street area; forming a light-emitting structure on the first substrate; forming a conductive structure between the first substrate and the light-emitting structure; removing a part of the light-emitting structure in the street area to expose a sidewall of the light-emitting structure in the chip area; forming a passivation layer on the light-emitting structure in the chip area; and forming a second passivation layer on the conductive structure in the street area, on the sidewalls of the light-emitting structure, and on the sidewalls of the first passivation layer; wherein one of the first passivation layer and the second passivation layer is a single-layer structure or a multilayer structure, wherein one of the first passivation layer and the second passivation layer comprises a DBR structure.

According to the aforementioned aspects, the present application provides a method for manufacturing a light-emitting device comprising the steps of: dry etching a portion of the light-emitting structure in the street areas; and wet etching the remained portion of the light-emitting structure in the street areas.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein:

FIG. 1 through FIG. 14 are schematic flow diagrams showing the process for manufacturing a light-emitting device 1 in accordance with a first embodiment of the present application; and FIG. 15 through FIG. 28 are schematic flow diagrams showing the process for manufacturing a light-emitting device 2 in accordance with a second embodiment of the present application.

DETAILED DESCRIPTION OF THE PREFERRED EMBODIMENTS

The present application discloses a light-emitting device and a method for manufacturing the same. In order to make the illustration of the present application more explicit, the following description is stated with reference to FIG. 1 through FIG. 28.

Figure 1:
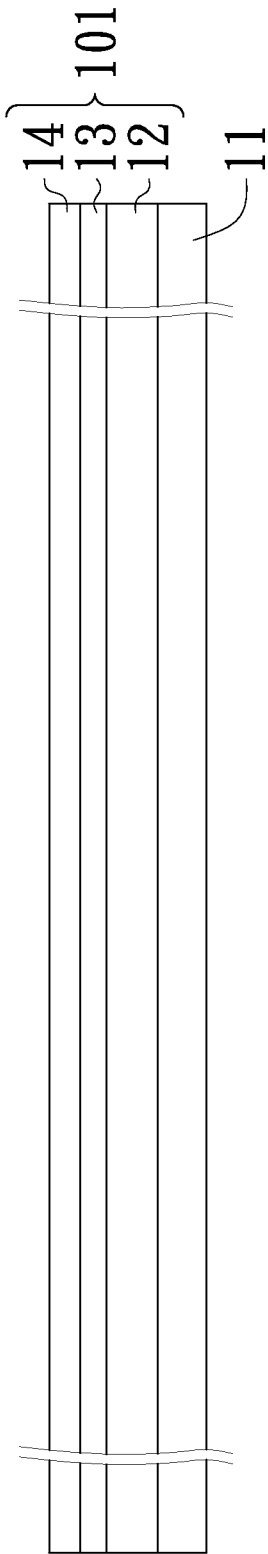

FIG. 1 through FIG. 14 are schematic flow diagrams showing the process for manufacturing a light-emitting device 1 in accordance with a first embodiment of the present application. As FIG. 1 shows, a growth substrate 11 is provided for the epitaxial growth of epitaxial materials formed thereon, wherein a material of the growth substrate 11 may be sapphire. A light-emitting structure 101 is grown on the growth substrate 11 by, for example, metal organic chemical vapor deposition (MOCVD) method, liquid phase deposition (LPD) method, or molecular beam epitaxy (MBE) method. In the embodiment, the light-emitting structure 101 comprises a first conductivity type group III-V compound semiconductor layer 12, an active layer 13, and a second conductivity type group III-V compound semiconductor layer 14 stacked on the growth substrate 11. For example, the first conductivity type group III-V compound semiconductor layer is n-type AlInGaN series material, the active layer is AlInGaN series material, and the second conductivity type group III-V compound semiconductor layer is p-type AlInGaN series material.

Figure 2:
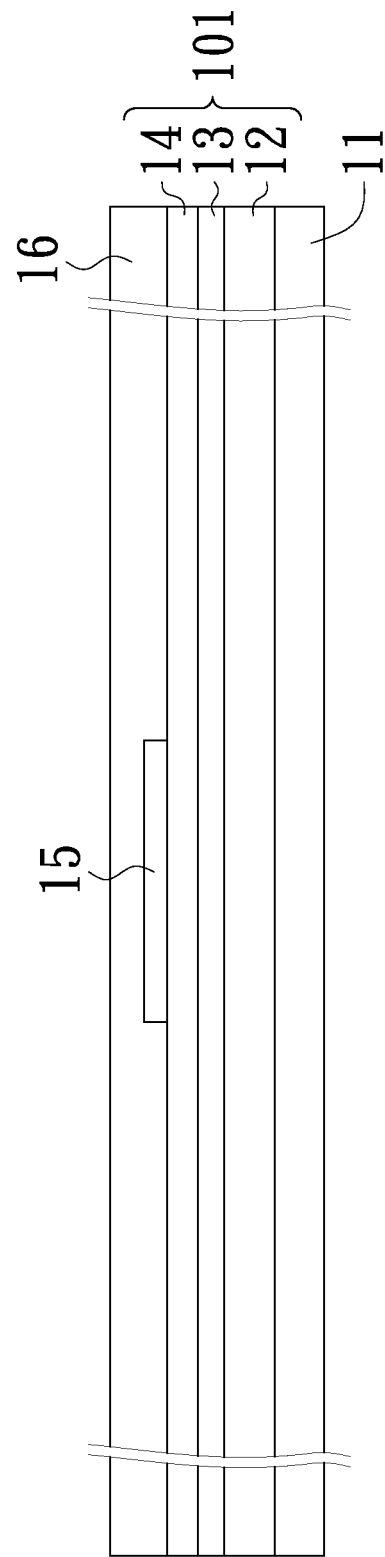
Figure 3:
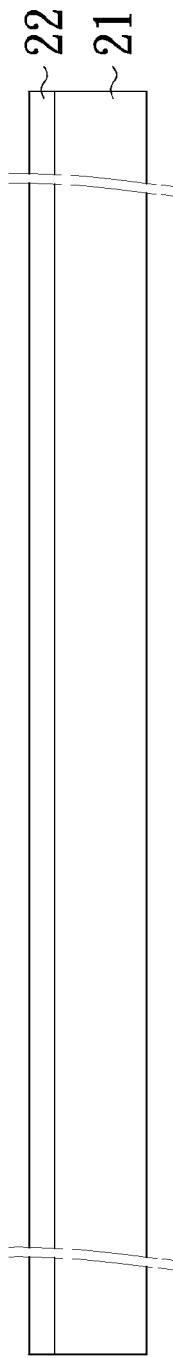
Figure 4:
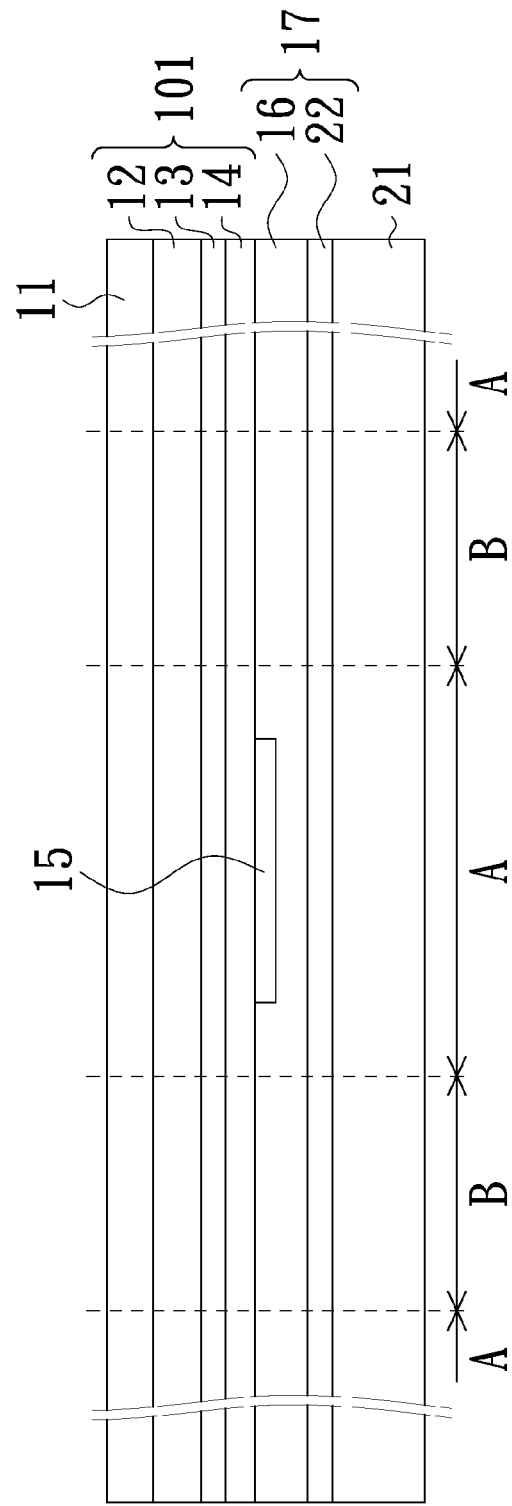
Figure 5:
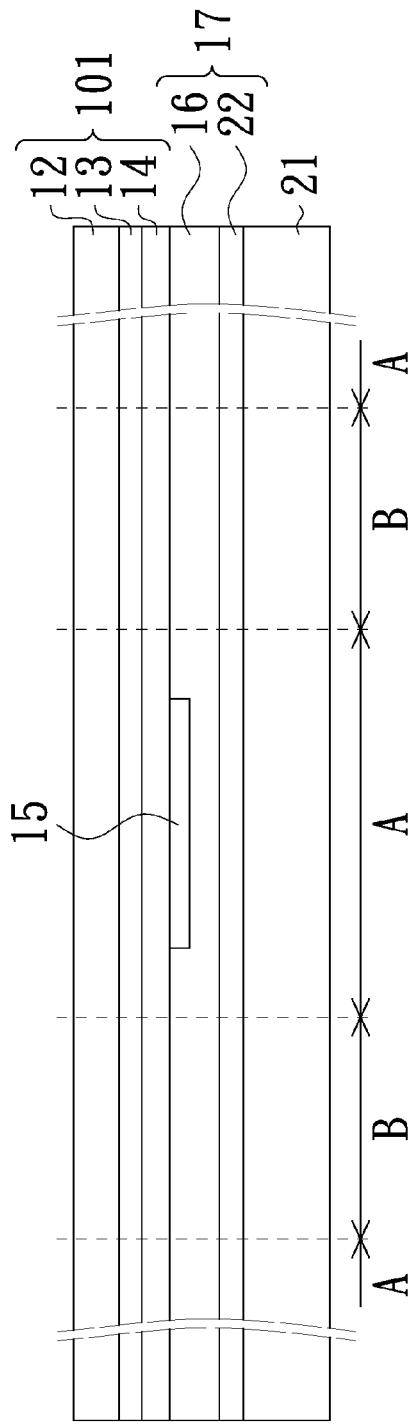

As FIG. 2 shows, a reflective layer 15 is deposited on the a partial region of the second conductivity type group III-V compound semiconductor layer 14 of the light-emitting structure 101. Next, a conductive region 16 is deposited on the reflective layer 15 and on other partial region of the second conductivity type group III-V compound semiconductor layer 14 that is not covered by the reflective layer 15. Next, a conductive substrate 21 and a connecting region 22 formed on the conductive substrate 21 are provided as shown in FIG. 3. The conductive region 16 is connected with the conductive substrate 21 by the connecting region 22 as shown in FIG. 4. There are chip areas A and street areas B in the structure as shown in FIG. 4. The street areas B are for subsequent chip dicing processes. The conductive region 16 facilitates the electrical conduction between the light-emitting structure 101 and the conductive substrate 21. The conductive region 16 can optionally reflect the light emitted from the light-emitting structure 101 such that the reflective layer 15 can be omitted. The connecting region 22 connects the conductive region 16 and the conductive substrate 21, and forms a conductive structure 17 with the conductive region 16. Next, the growth substrate 11 is removed by laser irradiation, lapping, or dry etching with inductively coupled plasma etching, as shown in FIG. 5.

Figure 6:
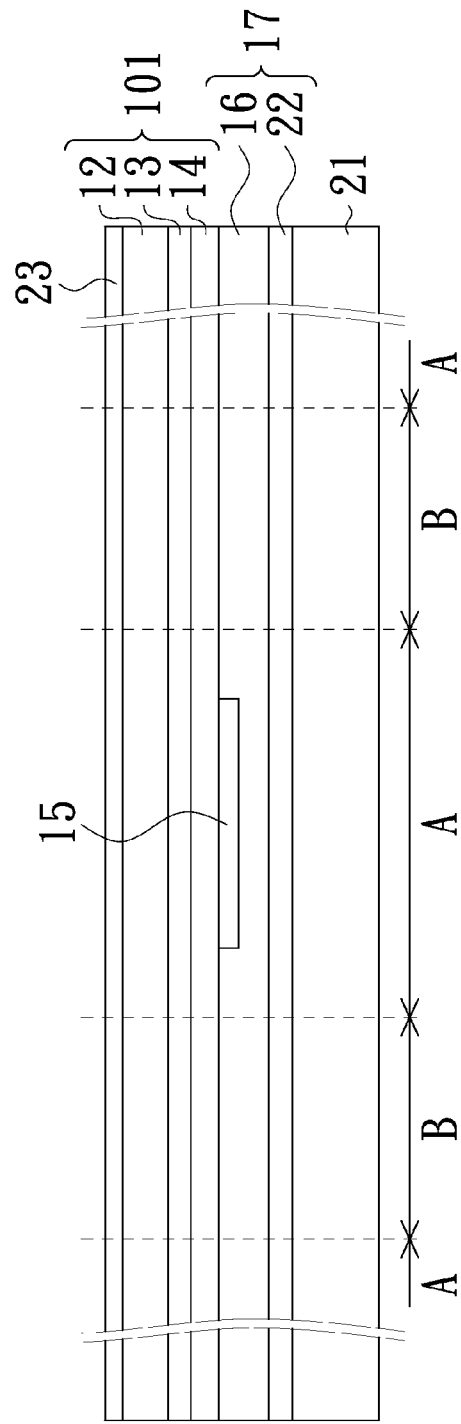
Figure 7:
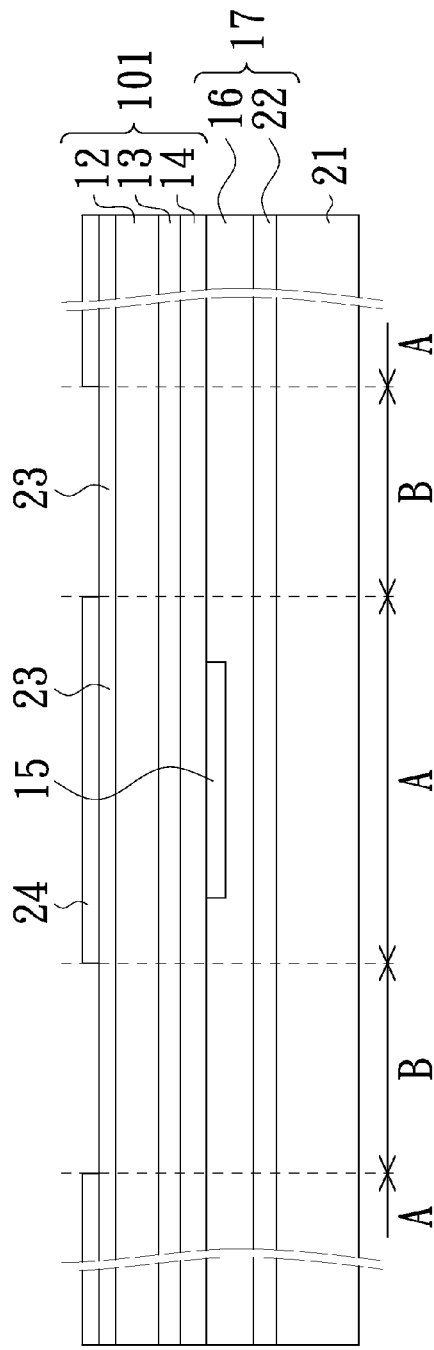
Figure 8:
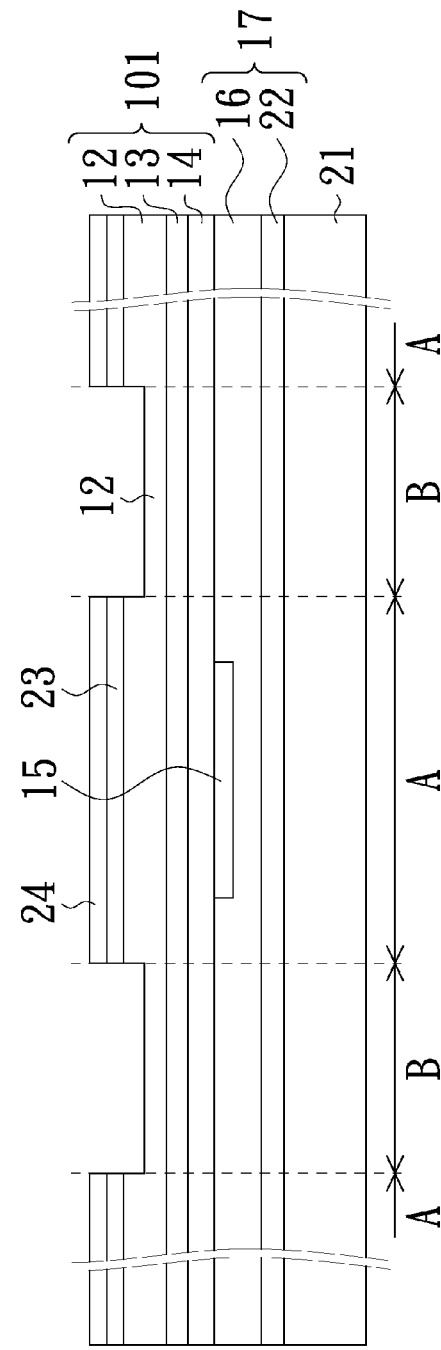

A mask layer 23 is formed on the light-emitting structure 101, as shown in FIG. 6. A photoresist layer 24 is formed on the mask layer 23 in the chip areas A, as shown in FIG. 7. The mask layer 23 and a portion of the first conductivity type semiconductor layer 12 in the street areas B are dry etched by inductively coupled plasma etching, as shown in FIG. 8. A remaining portion of the first conductivity type semiconductor layer 12, a remaining portion of the active layer 13, and a remaining portion of the second conductivity type semiconductor layer 14 in the street areas B are wet etched by using a solution containing $H_3PO_4$, to expose the conductive structure 17, as shown in FIG. 9. After the step of wet etching, a tilt sidewall 20 of the light-emitting structure 101 is formed in the chip areas A, wherein a tilt angle θ of the tilt sidewall 20 between the conductive substrate 21 and the light-emitting structure 101 is between around 40° and 80°. Next, the photoresist layer 24 and the mask layer 23 on the light-emitting structure 101 in the chip areas A are removed, as shown in FIG. 10. A passivation layer 25 is then formed on the light-emitting structure 101 in the chip areas A on the exposed conductive structure 17 in the street areas B, and on the sidewall of the light-emitting structure 101, as shown in FIG. 11.

Figure 13:
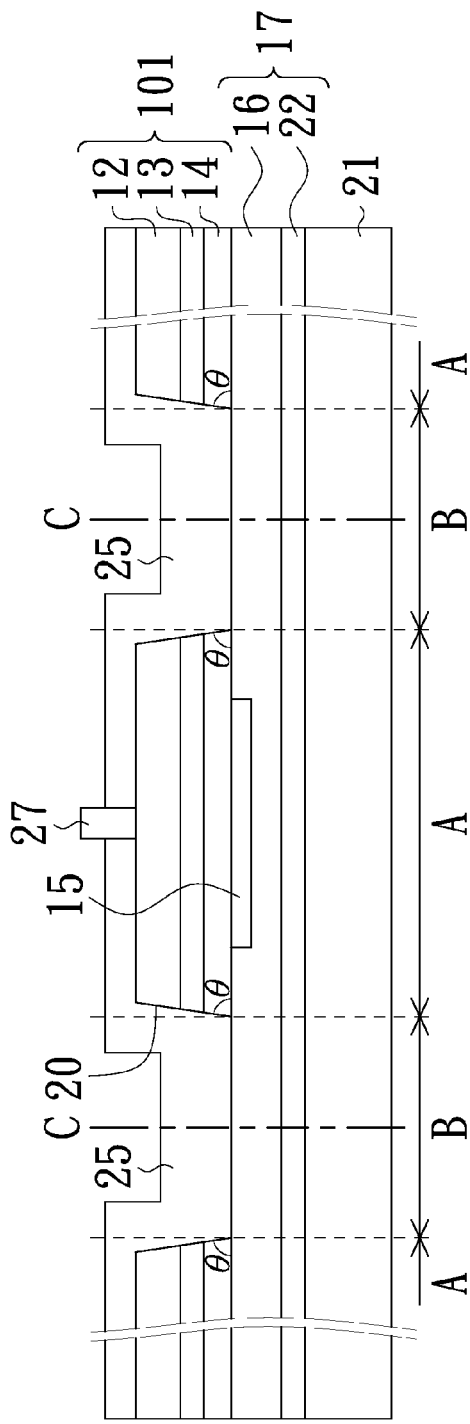
Figure 14:
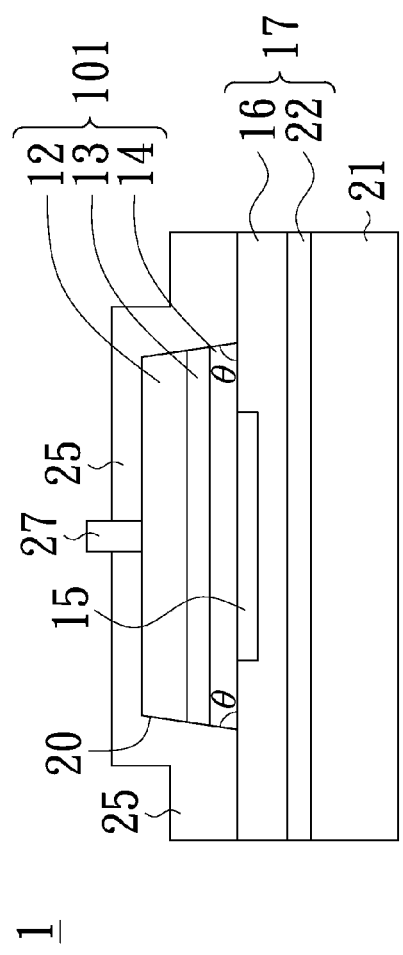

In FIG. 12, a through-hole 26 is formed through the passivation layer 25 to expose part of the first conductivity type semiconductor layer 12 in the chip areas A. Next, as FIG. 13 shows, an electrode 27 is formed by filling a metal material in the through-hole 26 and protruding from the through-hole 26. A plurality of light-emitting devices is formed by dicing along the cutting lines C in the street areas B, as shown in FIG. 13. The fabrication of a light-emitting device 1 is substantially completed as shown in FIG. 14.

Figure 15:
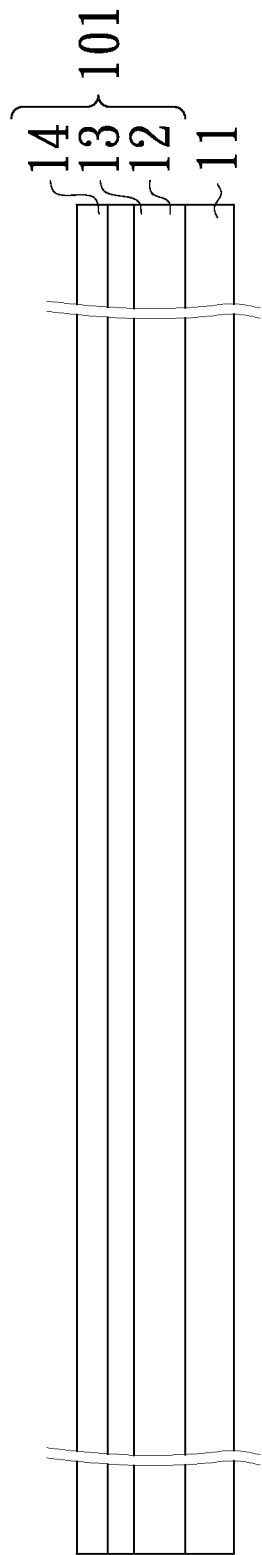

FIG. 15 through FIG. 28 are schematic flow diagrams showing the process for manufacturing a light-emitting device 2 in accordance with a second embodiment of the present application. As FIG. 15 shows, a growth substrate 11 is provided for the epitaxial growth of epitaxial materials formed thereon, wherein a material of the growth substrate 11 may be sapphire. A light-emitting structure 101 is grown on the growth substrate 11 by, for example, metal organic chemical vapor deposition (MOCVD) method, liquid phase deposition (LPD) method, or molecular beam epitaxy (MBE) method. In the embodiment, the light-emitting structure 101 comprises a first conductivity type group III-V compound semiconductor layer 12, an active layer 13, and a second conductivity type group III-V compound semiconductor layer 14 stacked on the growth substrate 11. For example, the first conductivity type group III-V compound semiconductor layer is n-type AlInGaN series material, the active layer is AlInGaN series material, and the second conductivity type group III-V compound semiconductor layer is p-type AlInGaN series material.

Figure 16:
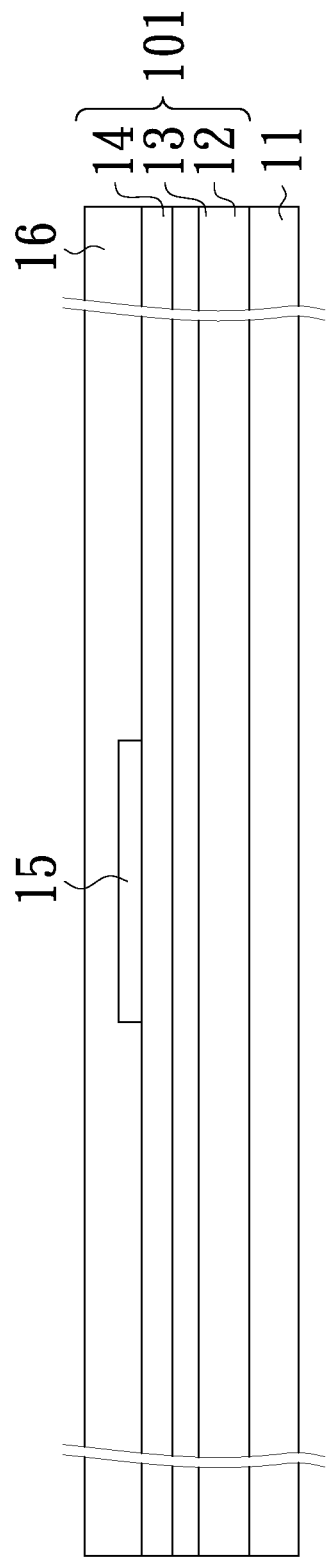

As FIG. 16 shows, a reflective layer 15 is deposited on the partial region of the second conductivity type group III-V compound semiconductor layer 14 of the light-emitting structure 101. Next, a conductive region 16 is deposited on the reflective layer 15 and on other the partial region of the second conductivity type group III-V compound semiconductor layer 14 that is not covered by the reflective layer 15. Next, a conductive substrate 21 and a connecting region 22 formed on the conductive substrate 21 are provided as shown in FIG. 17. The conductive region 16 is connected with the conductive substrate 21 by the connecting region 22 as shown in FIG. 18. There are chip areas A and street areas B in the structure as shown in FIG. 18. The street areas B are for the following dicing processes. The conductive region 16 facilitates the electrical conduction between the light-emitting structure 101 and the conductive substrate 21. The conductive region 16 can optionally reflect the light emitted from the light-emitting structure 101, such that the reflective layer 15 can be omitted. The connecting region 22 connects the conductive region 16 and the conductive substrate 21, and forms a conductive structure 17 with the conductive region 16. The growth substrate 11 is removed by laser irradiation, lapping, or dry etching with inductively coupled plasma etching, as shown in FIG. 19.

A first passivation layer 25a is formed on the light-emitting structure 101, as shown in FIG. 20. A photoresist layer 24 is formed on the first passivation layer 25a in the chip areas A, as shown in FIG. 21. The first passivation layer 25a and a portion of the first conductivity type semiconductor layer 12 in the street areas B are dry etched by inductively coupled plasma etching, as shown in FIG. 22. A remaining portion of the first conductivity type semiconductor layer 12, a remaining portion of the active layer 12, and a remaining portion of the second conductivity type semiconductor layer 14 in the street areas B are wet etched by using a solution containing $H_3PO_4$, to expose the conductive structure 17, as shown in FIG. 23. After the step of wet etching, a tilt sidewall 20 of the light-emitting structure 101 is formed in the chip areas A, wherein a tilt angle θ of the tilt sidewall 20 between the conductive substrate 21 and the light-emitting structure 101 is between 40° and 80°. A second passivation layer 25b is formed on the photoresist layer 24 in the chip areas A, on the exposed conductive structure 17 in the street areas B, on the sidewall of the light-emitting structure 101, and on a sidewall of the first passivation layer 24, as shown in FIG. 24. The second passivation layer 25b and the photoresist layer 24 in the chip areas A are removed and thus the first passivation layer 25a is exposed, as shown in FIG. 25.

Figure 27:
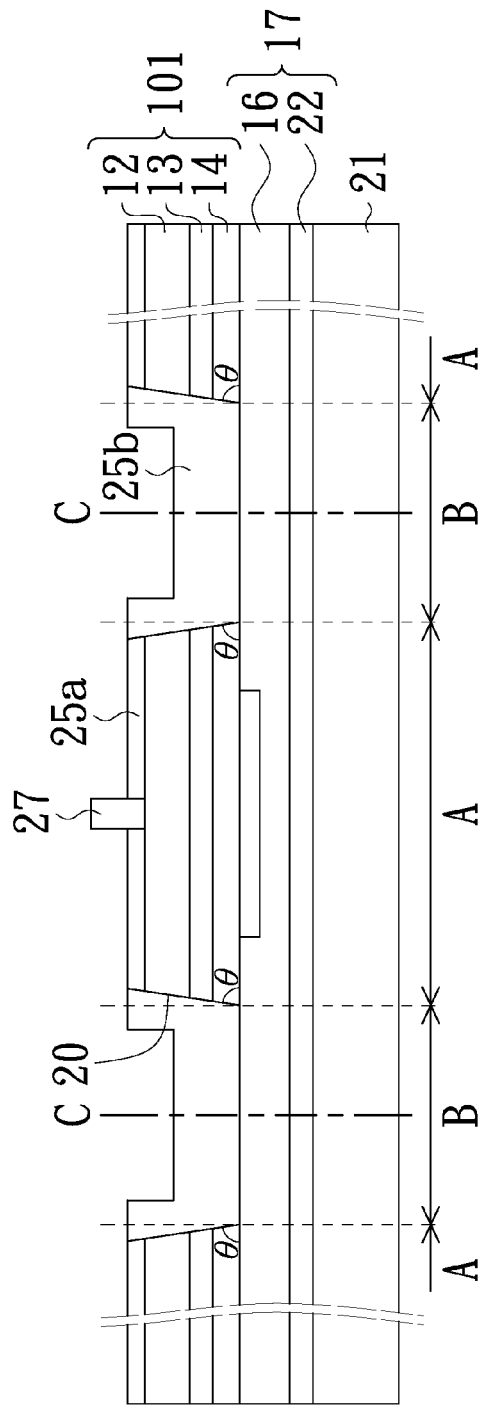
Figure 28:
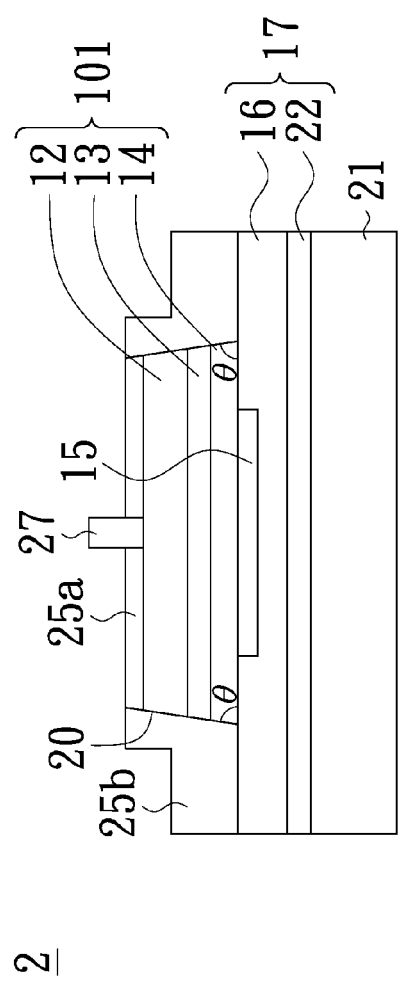

In FIG. 26, a through-hole 26 is formed through the first passivation layer 25a to expose a part of the first conductivity type semiconductor layer 12 in the chip areas A. Next, as FIG. 27 shows, an electrode 27 is formed by filling a metal material in the through-hole 26 and protruding from the through-hole 26. A plurality of light-emitting devices is formed by dicing along the cutting lines C in the street areas B, as shown in FIG. 27. The fabrication of a light-emitting device 2 is substantially completed as shown in FIG. 28.

The conductive region 16 can be a single-layer structure or multi-layer structure. The material of the conductive region 16 may be metals or metal alloys. The material of the connecting region 22 may be Al, Au, Pt, Zn, Ag, Ni, Ge, In, Sn, Ti, Pb, Cu, Pd, or alloys of the aforementioned metals. In another embodiment, the material of the connecting region 22 may be silver glue, spontaneous conductive polymer, polymer materials mixed with conductive materials, or anisotropic conductive film (ACF). The material of the mask layer 23, the passivation layer 25, the first passivation layer 25a, and the second passivation layer 25b comprises dielectric material, and the dielectric material may be $SiO_2$, $Al_2O_3$, $Si_3N_4$, $ZrO_2$, and $TiO_2$. In another embodiment, the refraction index of the passivation layer 25, the first passivation layer 25a, and the second passivation layer 25b is different from the light-emitting structure 101. The passivation layer 25, the first passivation layer 25a, and the second passivation layer 25b can be a single-layer structure or multi-layer structure. In another embodiment, the passivation layer 25, the first passivation layer 25a, and the second passivation layer 25b comprise DBR structure. The material of the electrode 27 comprises metal material, and the metal material can be Cr, Ti, Ni, Pt, Cu, Au, Al, W, Sn, or Ag. The material of the conductive substrate 21 can be germanium (Ge), copper (Cu), aluminum (Al), molybdenum (Mo), tungsten copper (CuW), silicon aluminum (SiAl), gallium arsenide (GaAs), indium phosphide (InP), silicon carbide (SiC), silicon (Si), gallium nitride (GaN), aluminum nitride (MN) or diamond-like carbon (DLC).

In the above embodiments of this application, a first passivation layer 25a is formed on the top of the light-emitting structure 101 by a one step lithography process to avoid the failure of the light-emitting device due to a high reverse leakage current and to avoid metal impurity attached to the sidewall of the light-emitting structure 101 in the chip areas A. A dry etching process and a wet etching process are used to etch the mask layer 23, the first passivation layer 25a, and the light-emitting structure 101 in the street areas B. After wet etching, a tilt sidewall 20 of the light-emitting structure is formed in the chip areas and the tilt sidewall 20 can decrease the critical angle of total reflection in the light-emitting structure, so the light extraction of the light-emitting device is increased.

In accordance with the embodiments in the application, the first conductivity type group III-V compound semiconductor layer 12 and the second conductivity type group III-V compound semiconductor layer 14 are two single-layer structures or two multi-layer structures ("multi-layer" means two or more than two layers) having different electrical properties, polarities, dopants for providing electrons or holes respectively. If the first conductivity type group III-V compound semiconductor layer 12 and the second conductivity type group III-V compound semiconductor layer 14 are composed of the semiconductor materials, the conductivity type can be any two of p-type, n-type, and i-type. The active layer 13 disposed between the first conductivity type group III-V compound semiconductor layer 12 and the second conductivity type group III-V compound semiconductor layer 14 is a region where the light energy and the electrical energy could transfer or could be induced to transfer. In another embodiment of this application, the light emission spectrum of the light-emitting device 1 can be adjusted by changing the physical or chemical arrangement of one or more layers in the active layer. The material of the active layer 13 can be AlGaInP or AlGaInN. The structure of the active layer 13 can be a single heterostructure (SH), a double heterostructure (DH), a double-side double heterostructure (DDH), or a multi-quantum well (MQW) structure. Besides, the wavelength of the emitted light could also be adjusted by changing the number of the pairs of the quantum well in a MQW structure.

In one embodiment of this application, a buffer layer (not shown) could be optionally formed between the growth substrate 11 and the first conductivity type group III-V compound semiconductor layer 12. The buffer layer between two material systems can be used as a buffer system. For the structure of the light-emitting device, the buffer layer is used to reduce the lattice mismatch between two material systems. On the other hand, the buffer layer could also be a single layer, multiple layers, or a structure to combine two materials or two separated structures. The material of the buffer layer can be organic, inorganic, metal, semiconductor, and so on, and the function of the buffer layer can be as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on. The material of the buffer layer can be AlN, GaN, or other suitable materials. The fabricating method of the buffer layer can be sputter or atomic layer deposition (ALD).

A contact layer (not shown) can also be optionally formed on the second conductivity type group III-V compound semiconductor layer 14. The contact layer is disposed on the side of the second conductivity type group III-V compound semiconductor layer 14 away from the active layer 13. Specifically speaking, the contact layer could be an optical layer, an electrical layer, or the combination thereof. An optical layer can change the electromagnetic radiation or the light from the actrive layer 13 or entering the active layer 13. The term "change" here means to change at least one optical property of the electromagnetic radiation or the light. The abovementioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, and capacitance between any two opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is between about 0.005 µm and 0.6 µm.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing a light-emitting device comprising the steps of:
   providing a first substrate, a chip area, and a street area;
   forming a light-emitting structure on the first substrate;
   forming a conductive structure between the first substrate and the light-emitting structure;
   removing a part of the light-emitting structure in the street area to expose a sidewall of the light-emitting structure in the chip area;
   forming a first passivation layer on the light-emitting structure in the chip area;
   forming a second passivation layer on the conductive structure in the street area, on the sidewalls of the light-emitting structure, and on the sidewalls of the first passivation layer; and
   forming a through-hole in the first passivation layer, and forming an electrode in the through-hole.

2. The method according to claim 1, further comprising a step of forming a reflective layer between the light-emitting structure and the first substrate.

3. The method according to claim 1, wherein forming the light-emitting structure comprising the steps of:
   forming a first conductivity type group III-V compound semiconductor layer;
   forming an active layer on the first conductivity type group III-V compound semiconductor layer; and
   forming a second conductivity type group III-V compound semiconductor layer on the active layer.

4. The method according to claim 1, wherein the sidewall of the light-emitting structure is a tilt sidewall.

5. The method according to claim 4, wherein a tilt angle between the first substrate and the light-emitting structure is between 40° and 80°.

6. The method according to claim 1, further comprising a step of dicing along a cutting line in the street area to form a plurality of light-emitting devices.

7. The method according to claim 1, wherein the step of forming the conductive structure comprises the steps of:
   forming a connecting region on the first substrate; and
   forming a conductive region between the connecting region and the light-emitting structure.

8. The method according to claim 7, wherein the material of the connecting region comprises metal, silver glue, conductive polymer, polymer material mixed with conductive material, or anisotropic conductive film.

9. The method according to claim 1, wherein a refraction index of the first passivation layer and/or the second passivation layer is different from that of the light-emitting structure.

10. The method according to claim 1, wherein the first passivation layer and/or the second passivation layer is a single-layer structure or a multilayer structure.

11. The method according to claim 1, wherein the material of the first passivation layer and/or the second passivation layer comprises dielectric material.

12. The method according to claim 11, wherein the material of the first passivation layer and the second passivation layer are the same or different.

13. The method according to claim 1, wherein the first substrate is conductive.

14. The method according to claim 1, wherein the step of forming the light-emitting structure on the first substrate comprises a step of providing a second substrate for growing the light-emitting structure.

15. The method according to claim 14, wherein the step of forming the light-emitting structure on the first substrate further comprises a step of separating the light-emitting structure from the second substrate and bonding the light-emitting structure to the first substrate.

16. A method for manufacturing a light-emitting device comprising the steps of:
   providing a first substrate, a chip area, and a street area;
   forming a light-emitting structure on the first substrate;
   forming a conductive structure between the first substrate and the light-emitting structure;
   removing a part of the light-emitting structure in the street area to expose a sidewall of the light-emitting structure in the chip area;
   forming a first passivation layer on the light-emitting structure in the chip area; and
   forming a second passivation layer on the conductive structure in the street area, on the sidewalls of the light-emitting structure, and on the sidewalls of the first passivation layer;
   wherein the step of removing a part of the light-emitting structure comprises the steps of:
   dry etching a part of the light-emitting structure in the street area; and
   wet etching a remaining part of the light-emitting structure in the street area.

17. The method according to claim 16, wherein the dry etching step comprises using inductively coupled plasma etching.

18. The method according to claim 16, wherein the wet etching step comprises using a solution containing $H_3PO_4$.

19. A method for manufacturing a light-emitting device comprising the steps of:
   providing a first substrate, a chip area, and a street area;
   forming a light-emitting structure on the first substrate;
   forming a conductive structure between the first substrate and the light-emitting structure;

removing a part of the light-emitting structure in the street area to expose a sidewall of the light-emitting structure in the chip area;

forming a first passivation layer on the light-emitting structure in the chip area; and forming a second passivation layer on the conductive structure in the street area, on the sidewalls of the light-emitting structure, and on the sidewalls of the first passivation layer;

wherein one of the first passivation layer and the second passivation layer is a single-layer structure or a multi-layer structure, wherein one of the first passivation layer and the second passivation layer comprises a DBR structure.

* * * * *